US008248794B2

(12) United States Patent
Li et al.

(10) Patent No.: US 8,248,794 B2
(45) Date of Patent: Aug. 21, 2012

(54) HEAT DISSIPATION DEVICE AND ELECTRONIC DEVICE USING THE SAME

(75) Inventors: Min Li, Shenzhen (CN); Lei Cao, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 203 days.

(21) Appl. No.: 12/754,594

(22) Filed: Apr. 5, 2010

(65) Prior Publication Data

US 2011/0096501 A1    Apr. 28, 2011

(30) Foreign Application Priority Data

Oct. 26, 2009  (CN) .......................... 2009 1 0308840

(51) Int. Cl.
  *H05K 7/20* (2006.01)
(52) U.S. Cl. ......... 361/695; 361/694; 361/691; 361/692
(58) Field of Classification Search .................. 361/691, 361/692, 694, 695, 697, 679.49; 165/80.3, 165/80.4, 104.34; 454/184–186; 700/299, 700/300
See application file for complete search history.

(56) References Cited

U.S. PATENT DOCUMENTS

| | | | | |
|---|---|---|---|---|
| 3,443,588 A * | 5/1969 | Banko | ...................... | 137/601.08 |
| 3,746,042 A * | 7/1973 | Finkel | ...................... | 137/601.06 |
| 4,452,391 A * | 6/1984 | Chow | ........................... | 236/49.3 |
| 4,541,326 A * | 9/1985 | Fukuda et al. | ................ | 454/258 |
| 5,020,423 A * | 6/1991 | Hill | ............................... | 454/319 |
| 5,364,303 A * | 11/1994 | Terry | ............................. | 454/155 |
| 5,443,420 A * | 8/1995 | Kim et al. | ..................... | 454/256 |
| 5,769,709 A * | 6/1998 | Kim | ................................ | 454/318 |
| 6,031,719 A * | 2/2000 | Schmitt et al. | ................ | 361/695 |
| 6,484,521 B2 * | 11/2002 | Patel et al. | ....................... | 62/171 |
| 6,736,196 B2 * | 5/2004 | Lai et al. | ........................ | 165/122 |
| 6,817,196 B2 * | 11/2004 | Malone et al. | .................. | 62/171 |
| 6,826,048 B1 * | 11/2004 | Dean et al. | .................... | 361/695 |
| 7,236,361 B2 * | 6/2007 | Cote et al. | ..................... | 361/695 |
| 7,316,606 B2 * | 1/2008 | Shipley et al. | ................ | 454/184 |
| 7,399,222 B2 * | 7/2008 | Moon et al. | .................. | 454/277 |
| 7,656,664 B2 * | 2/2010 | Ye et al. | ........................ | 361/695 |
| 7,835,149 B2 * | 11/2010 | Li et al. | .................... | 361/679.49 |
| 7,852,628 B2 * | 12/2010 | Hirohata et al. | .............. | 361/695 |
| 8,000,100 B2 * | 8/2011 | Kao et al. | ..................... | 361/695 |
| 2001/0014284 A1 * | 8/2001 | McCabe | ........................ | 415/146 |
| 2004/0159713 A1 * | 8/2004 | Schmidt et al. | ............... | 236/49.3 |

(Continued)

FOREIGN PATENT DOCUMENTS

JP    57077847 A  *  5/1982

(Continued)

*Primary Examiner* — Anatoly Vortman
(74) *Attorney, Agent, or Firm* — Altis Law Group, Inc.

(57) ABSTRACT

An exemplary heat dissipation device includes a heat sink defining air passages therein, a fan holder fixedly mounted on the heat sink, a fan mounted on the fan holder, and an adjustable wind-guiding module located in and pivoted to the fan holder. The fan is positioned for generating an airflow flowing through the adjustable wind-guiding module generally toward the air passages of the heat sink. The adjustable wind-guiding module is selectably pivotable with respect to the fan holder such that a direction of the airflow generally toward the air passages of the heat sink is changed accordingly.

5 Claims, 7 Drawing Sheets

U.S. PATENT DOCUMENTS

| | | | |
|---|---|---|---|
| 2004/0194484 A1* | 10/2004 | Zou et al. | 62/186 |
| 2005/0176364 A1* | 8/2005 | Gehring et al. | 454/155 |
| 2006/0071087 A1* | 4/2006 | Kates | 236/1 B |
| 2006/0071089 A1* | 4/2006 | Kates | 236/94 |
| 2007/0095518 A1* | 5/2007 | Kates | 165/208 |
| 2007/0137243 A1* | 6/2007 | Lee et al. | 62/419 |
| 2007/0298706 A1* | 12/2007 | Hudon et al. | 454/256 |
| 2008/0024979 A1* | 1/2008 | Ye et al. | 361/691 |
| 2008/0218969 A1* | 9/2008 | Muraki | 361/695 |
| 2008/0310100 A1* | 12/2008 | Sherrod et al. | 361/687 |

FOREIGN PATENT DOCUMENTS

| | | | | |
|---|---|---|---|---|
| JP | 62210290 | A | * | 9/1987 |
| JP | 01079533 | A | * | 3/1989 |
| JP | 06066445 | A | * | 3/1994 |

* cited by examiner

HEAT DISSIPATION DEVICE AND ELECTRONIC DEVICE USING THE SAME

BACKGROUND

1. Technical Field

The disclosure relates to heat dissipation devices and, more particularly, to a heat dissipation device for dissipating heat generated by an electronic component and an electronic device using the heat dissipation device.

2. Description of Related Art

With the increasing development of computer technology, electronic components such as central processing units (CPUs) are able to operate at higher speeds and have greater functional capabilities. When an electronic component operates at high speed, it frequently generates large amounts of heat. The heat must be quickly removed from the electronic component to prevent it from becoming unstable or being damaged. Typically, a heat dissipation device is attached to an outer surface of the electronic component to absorb heat from the electronic component. The heat absorbed by the heat dissipation device is then dissipated to ambient air.

A typical heat dissipation device includes a heat sink and a fan mounted on the heat sink. The heat sink is attached to an outer surface of an electronic component to absorb heat generated by the electronic component. The fan provides a downward airflow flowing through the heat sink to take away the heat absorbed by the heat sink, thereby helping to keep the electronic component cool. However, a direction of the airflow produced by the fan is a fixed downward direction. That is, the fan only blows toward the electronic component located below the heat sink. The fan is basically unable to carry away heat generated by other electronic components located around the electronic component below the heat sink.

What is need, therefore, is a heat dissipation device that can overcome the above-described limitations, and an electronic device using such heat dissipation device.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
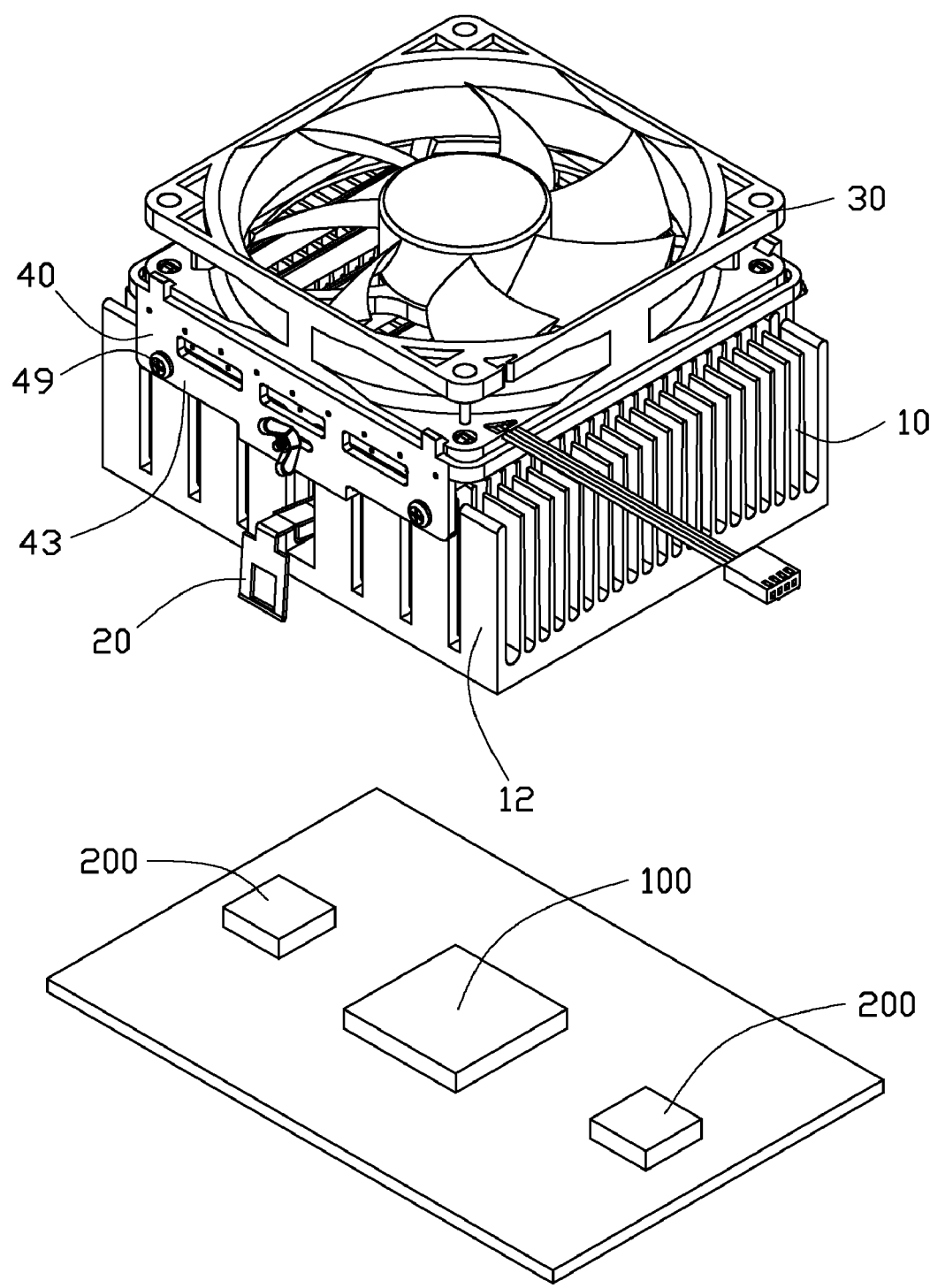
FIG. 1 is an isometric, assembled view of a heat dissipation device in accordance with an embodiment of the disclosure, showing the heat dissipation device ready to be attached on a printed circuit board with three electronic devices mounted thereon.
Figure 2:
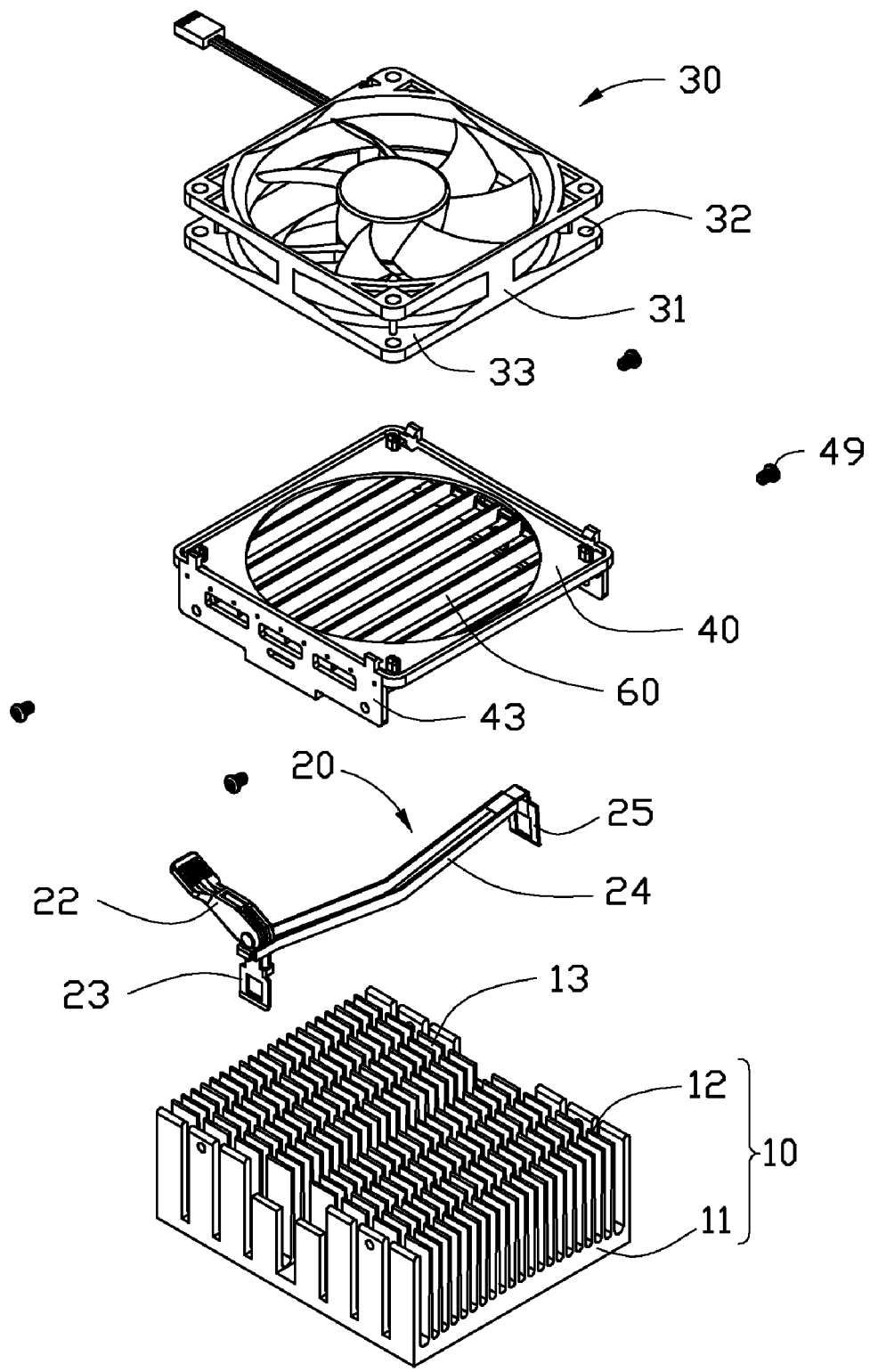
FIG. 2 is an exploded view of the heat dissipation device of FIG. 1, but viewed from another direction different from that of FIG. 1.

Referring to FIGS. 1-2, these illustrate a heat dissipation device in accordance with an embodiment of the disclosure. The heat dissipation device is used to dissipate heat generated by an electronic component 100 mounted on a printed circuit board (not labeled). The heat dissipation device comprises a heat sink 10, a clip 20 for securing the heat sink 10 to a top surface of the electronic component 100, a fan 30 located over the heat sink 10, a fan holder 40 sandwiched between the heat sink 10 and the fan 30, and an adjustable wind-guiding module 60 mounted in the fan holder 40. The adjustable wind-guiding module 60 changes a flow direction of an airflow produced by the fan 30 according to actual needs. The fan holder 40 secures the fan 30 to a top of the heat sink 10.

The heat sink 10 has a rectangular configuration. The heat sink 10 is made of material with high conductivity, such as aluminum or copper. The heat sink 10 comprises a heat spreader 11, and a plurality of fins 12 arranged on a top surface of the heat spreader 11. The fins 12 are arranged in an m×n array, and are parallel to each other. The fins 12 are spaced from each other to form a plurality of air passages 13. The air passages 13 are arranged in a crisscross pattern. The array of fins 12 includes two rows of endmost fins 12 at each of two opposite sides of the array. In each such row of endmost fins 12, the fins 12 are arranged such that main flat sides of the endmost fins 12 are all parallel with one another. The two endmost fins 12 located at a middle of the row have a height less than that of the other fins 12 in the row.

The clip 20 comprises a resilient member 24, a first latching portion 25 bending downwards from a first end of the resilient member 24, a handle 22, and a second latching portion 23. The handle 22 is pivotably connected to a second end of the resilient member 24, the second end being opposite to the first end. The second latching portion 23 is pivotably connected to the handle 22. The resilient member 24 is received in a corresponding air passage 13 in a middle of the heat sink 10. The resilient member 24 elastically resists the top surface of the heat spreader 11. The handle 22, the first latching portion 23 and the second latching portion 25 extend beyond the opposite sides of the heat sink 10. The first and second latching portions 23, 25 clasp a retention module (not shown) around the electronic component 100.

The fan 30 comprises a rectangular frame 31. The frame 31 comprises a pair of parallel plates 33. Four locating holes 32 are defined through the two plates 33 at four corners of the frame 31, respectively.

Figure 3:
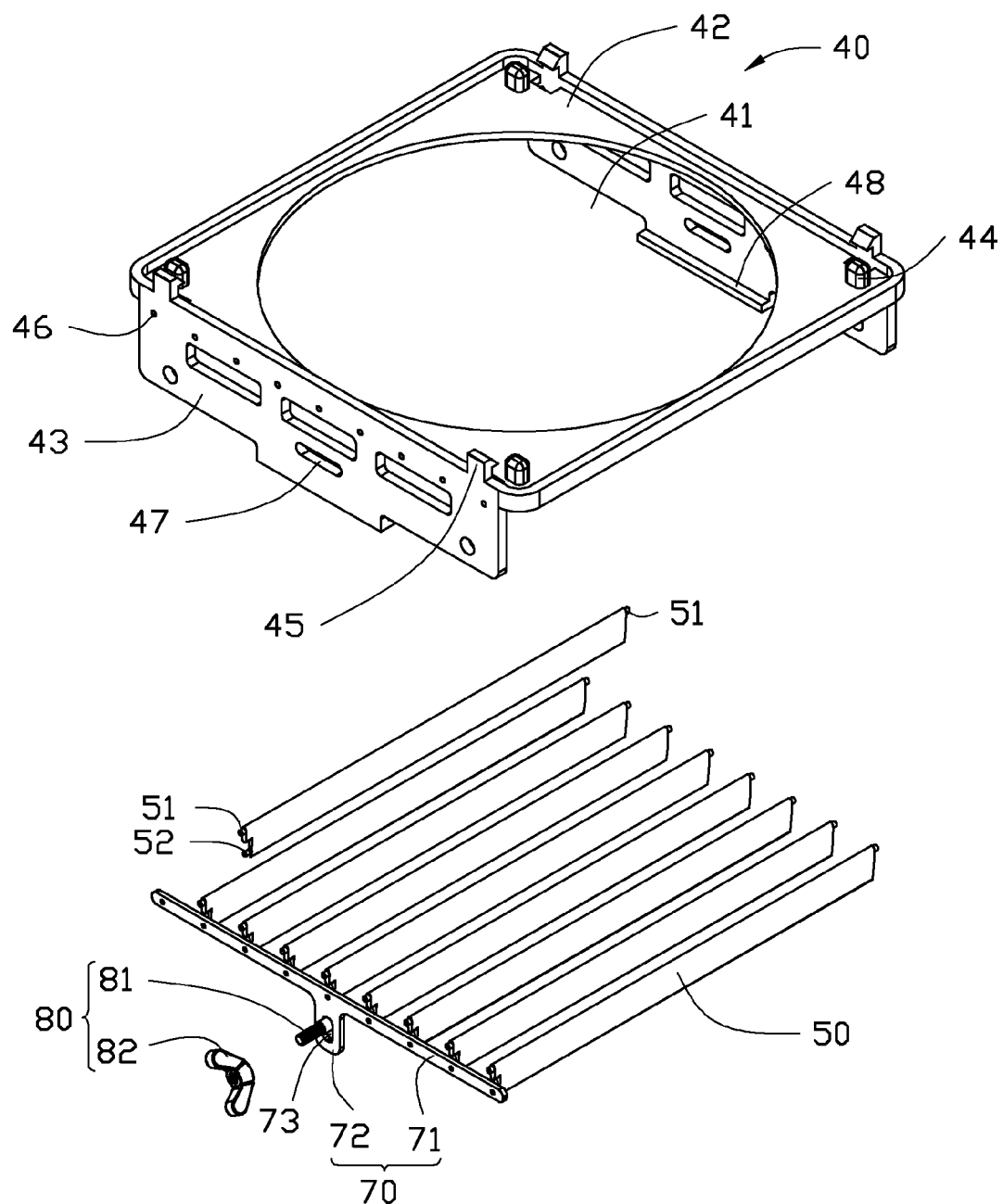
FIG. 3 is an exploded view of a fan holder and an adjustable wind-guiding module of the heat dissipation device of FIG. 2.
Figure 4:
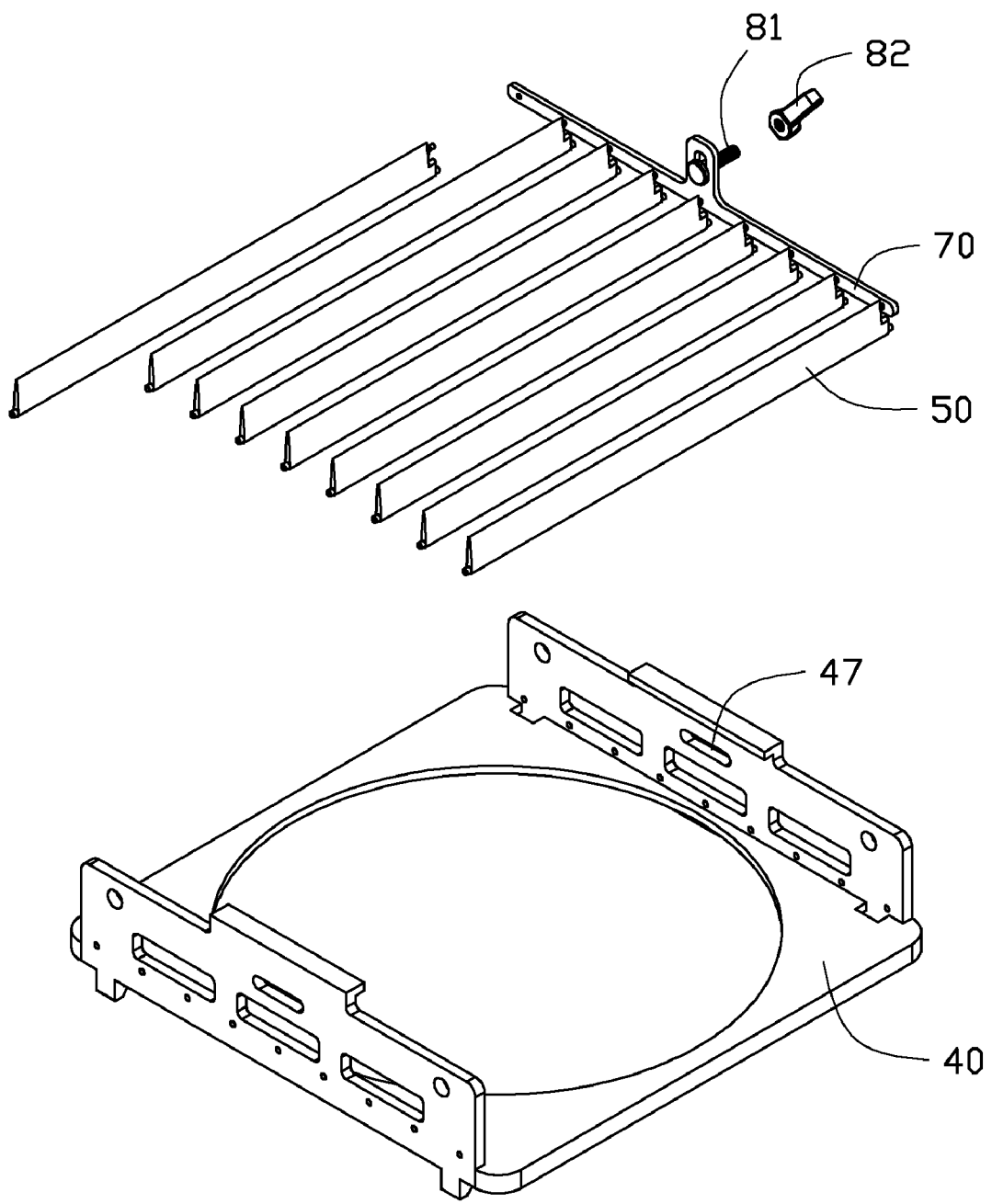
FIG. 4 is an inverted view of FIG. 3.

Also referring to FIGS. 3-4, the fan holder 40 comprises a supporting plate 42 defining a circular opening 41 in a center thereof, and two mounting plates 43 extending downwardly and perpendicularly from two opposite sides of the supporting plate 42. The opening 41 is in communication with corresponding air passages 13. Four pins 44 extend upwardly and perpendicularly from four corners of an upper side of the supporting plate 42, corresponding to the locating holes 32 of the fan 30. Four hooks 45 extend perpendicularly and upwardly from four corners of the upper side of the supporting plate 42. Two of the hooks 45 extend from two opposite ends of a top edge of one of the mounting plates 43, and the other two hooks 45 extend from two opposite ends of a top edge of the other one of the mounting plates 43. The hooks 45 are adjacent an outer edge of the supporting plate 42, and are adjacent corresponding pins 44, respectively. The pins 44 are received in corresponding locating holes 32 of the fan 30 to prevent the fan 30 from moving in directions parallel to the plates 33. The hooks 45 clasp a bottom one of the plates 33 of the fan 30 onto the supporting plate 42, to secure the fan 30 to the fan holder 40.

A central portion of a bottom end of each the mounting plate 43 bends inwardly to form a resisting portion 48. The resisting portions 48 are seated on the fins 12 located at the middle of the opposite sides of the heat sink 10, respectively. In this manner, each of the mounting plates 43 extends beyond the fins 12 located at the opposite sides of the heat sink 10. Each mounting plate 43 has two opposite ends thereof overlapping with corresponding fins 12. A plurality of screws 49 extend through the mounting plates 43 and engage in the corresponding fins 12 to fasten the fan holder 40 on the heat sink 10 (see FIG. 1). Each of the mounting plates 43 defines a plurality of pivoting holes 46 and an elongated horizontal slot 47 below the pivoting holes 46. The pivoting holes 46 of each mounting plate 43 are arranged in a straight line parallel to the top edge of the mounting plate 43. The horizontal slots 47 correspond to the resisting portions 48.

The adjustable wind-guiding module 60 comprises a plurality of wind-guiding wings 50, a generally T-shaped connecting frame 70 located at a side of the wind-guiding wings 50 and an adjuster 80 connecting the connecting frame 70 with a corresponding mounting plate 43 of the fan holder 40. The wind-guiding wings 50 are parallel to each other, and are for guiding the airflow produced by the fan 30 towards a selected direction.

Each of the wind-guiding wings 50 has an elongated configuration. Each wind-guiding wing 50 has an upper side and a lower side. The upper side of each wind-guiding wing 50 has a thickness larger than that of the lower side. A first pivot 52 is formed at a first end of each wind-guiding wing 50, and is located near the lower side of each wind-guiding wing 50. Two second pivots 51 extend outwards from the first end and a second end of each wind-guiding wing 50, respectively, the second end being opposite to the first end. The second pivots 51 are located near the upper side of each wind-guiding wing 50. The first pivot 52 and the second pivot 51 located at the first end are spaced from each other. The second pivots 51 of the wind-guiding wings 50 are inserted into corresponding pivoting holes 46 of the mounting plates 43, so that the wind-guiding wings 50 are pivotably connected to the mounting plates 43 of the fan holder 40. The wind-guiding wings 50 are able to rotate relative to the mounting plates 43. The first pivots 52 are pivotably connected to the connecting frame 70.

The connecting frame 70 comprises an elongated driving plate 71, and a connecting portion 72 extending downwardly from a central part of the driving plate 71. The first pivot 52 of each wind-guiding wing 50 is pivoted to the driving plate 71. The connecting portion 72 defines a vertical slot 73. The adjuster 80 comprises a bolt 81 and a knob 82 threadedly connected with the bolt 81. The knob 82 is located outside of the fan holder 40. The bolt 81 extends through the vertical slot 73 and the horizontal slot 47 of the corresponding mounting plate 43 of the fan holder 40 in that order to threadedly engage with the knob 82, thereby securing the connecting frame 70 to the corresponding mounting plate 43.

In adjustment of the airflow direction of the fan 30, first, the knob 82 is unscrewed from the bolt 81 slightly. Then the bolt 81 is slid in the horizontal slot 47 of the corresponding mounting plate 43 of the fan holder 40 to drive the connecting frame 70 to move relative to the corresponding mounting plate 43 to a desired position. Finally, the knob 82 is screwed tightly on the bolt 81. During the bolt 81 sliding transversely relative to the corresponding mounting plate 43 of the fan holder 40, the bolt 81 is simultaneously able to slide up or down slightly in the vertical slot 73 of the connecting frame 70. Thereby, the vertical slot 73 allows the bolt 81 to freely slide along the horizontal slot 47. In a process of the connecting frame 70 moving relative to the corresponding mounting plate 43, since the first pivots 52 and the second pivots 51 of the wind-guiding wings 50 are respectively pivoted to the connecting frame 70 and the mounting plates 43, the connecting frame 70 drives the wind-guiding wings 50 to rotate relative to the mounting plates 43.

Figure 5:
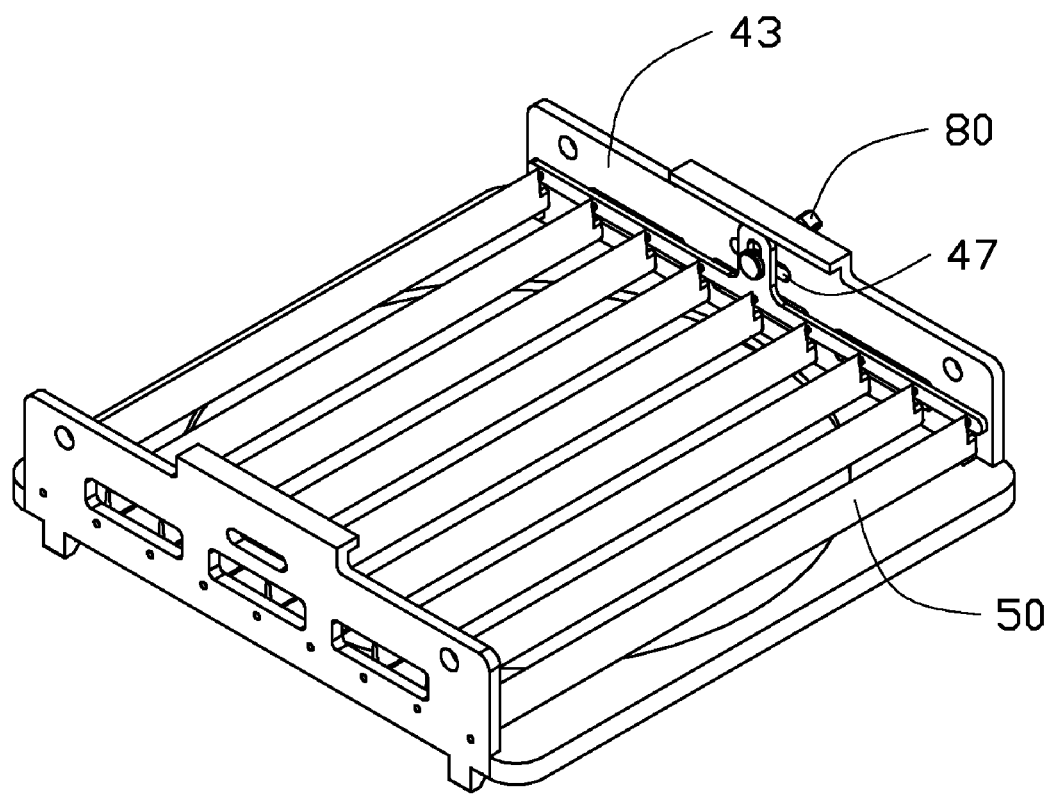
FIG. 5 is an assembled view of FIG. 4, showing wind-guiding wings of the adjustable wind-guiding module in vertical orientations.
Figure 6:
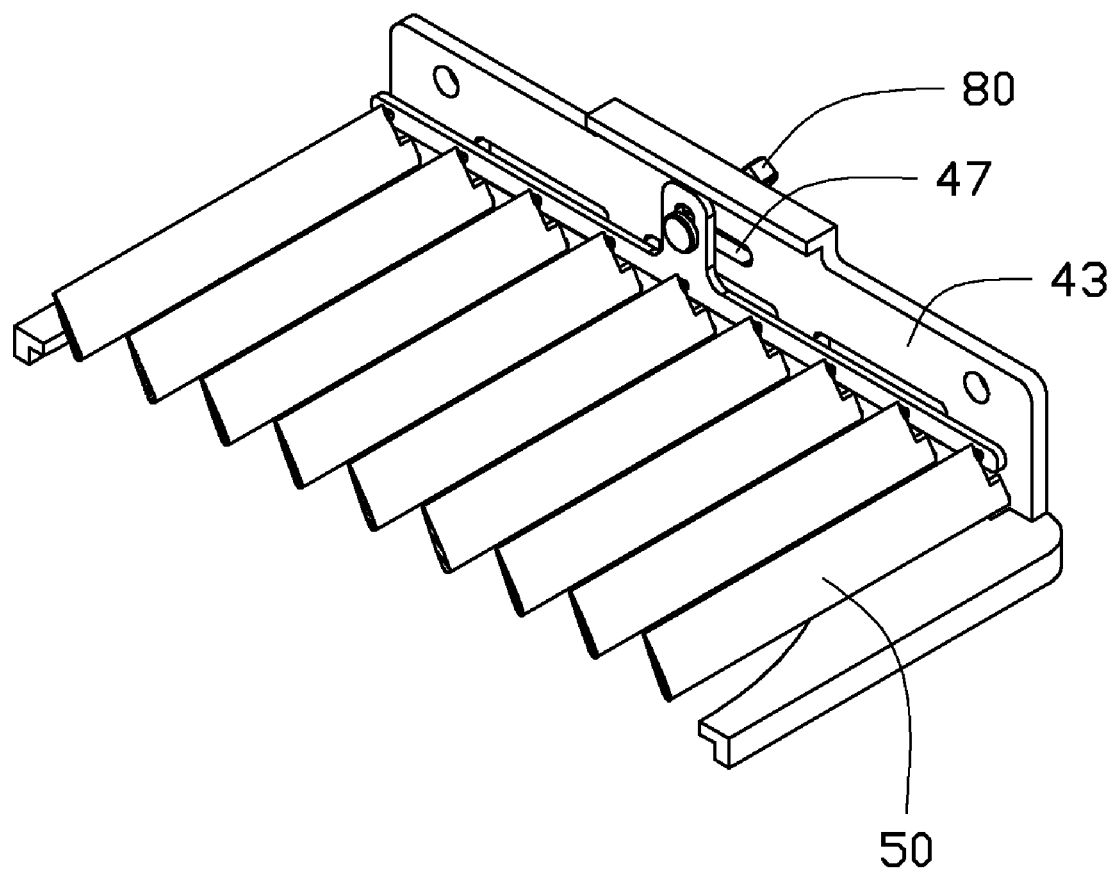
FIG. 6 is a cutaway view of FIG. 5, and showing the wind-guiding wings adjusted to be sloped, wherein tops of the wind-guiding wings point up toward the left side.
Figure 7:
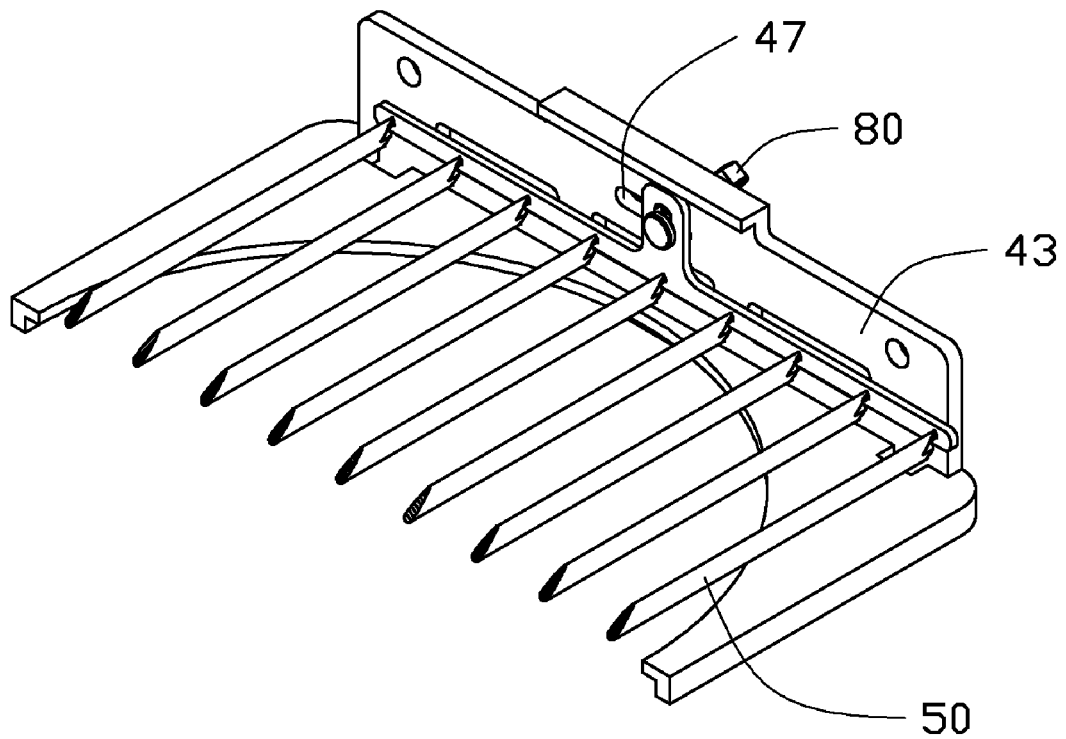
FIG. 7 is a cutaway view of FIG. 5, and showing the wind-guiding wings adjusted to be sloped, wherein tops of the wind-guiding wings point up toward the right side.

Referring to FIG. 5, this shows the bolt 81 of the adjuster 80 in a middle of the horizontal slot 47. In this position, the wind-guiding wings 50 are in a vertical state. Referring to FIG. 6, this the bolt 81 located at a first end of the horizontal slot 47. In this position, the wind-guiding wings 50 are turned towards a first side of the fan holder 40, thereby guiding the airflow produced by the fan 30 towards the first side of the fan holder 40. Referring to FIG. 7, this shows the bolt 81 located at a second end of the horizontal slot 47, the second end being opposite the first end. In this position, the wind-guiding wings 50 are turned towards a second side of the fan holder 40, thereby guiding the airflow produced by the fan 30 towards the second side of the fan holder 40, the second side being opposite to the first side.

From the above description, it can be seen that the airflow is able to be adjusted to blow towards a selected one of other electronic components 200 located around the electronic component 100, thereby carrying away heat generated by the other electronic component 200. In addition, the connecting frame 70 and the wind-guiding wings 50 are received in the fan holder 40, decreasing a volume of the heat dissipation device.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
    a heat sink defining a plurality of air passages therein;
    a fan holder fixedly mounted on the heat sink, the fan holder comprising a supporting plate and two mounting plates extending from two opposite sides of the supporting plate;
    a fan mounted on the supporting plate of the fan holder; and
    an adjustable wind-guiding module located in and pivoted to the fan holder, the fan being positioned for generating an airflow flowing through the adjustable wind-guiding module generally toward the air passages of the heat sink;
    wherein the adjustable wind-guiding module is selectably pivotable with respect to the fan holder such that a direction of the airflow generally toward the air passages of the heat sink is changed accordingly; and
    wherein the adjustable wind-guiding module comprises a plurality of wind-guiding wings, a connecting frame and an adjuster, the wind-guiding wings being parallel to and spaced from each other, each of the wind-guiding wings has a first end and a second end opposite to the first end, the first end and the second end of each of the wind-guiding wings being respectively pivoted to the two mounting plates of the fan holder, the connecting frame comprises an elongated driving plate and a connecting portion extending from the driving plate, the first end of each of the wind-guiding wings has an upper side pivoted to a corresponding mounting plate of the fan holder and a lower side pivoted to the driving plate, the connecting frame being movable relative to the corresponding mounting plate to make the lower side of the first end of each of the wind-guiding wings pivot about the upper side of the first end of each of the wind-guiding wings, the adjuster is configured for adjusting a relative location between the connecting frame and the mounting plate of the fan holder and selectably fixing the connecting frame relative to the fan holder such that the wind-guiding wings are selectably pivotable with respect to the fan holder, the adjuster comprises a bolt extending through the connecting portion of the connecting frame and the corresponding mounting plate of the fan holder, and a knob threadedly connected with the bolt, the bolt being slidable along horizontal directions relative to the corresponding mounting plate and being fixable relative to the corresponding mounting plate by threaded tightening of the knob on the bolt.

2. The heat dissipation device of claim 1, wherein the connecting portion of the connecting frame defines a vertical slot, the bolt of the adjuster being slidable along the vertical slot while simultaneously sliding along any of the horizontal directions relative to the corresponding mounting plate.

3. A heat dissipation device comprising:
a heat sink;
a fan holder secured to the heat sink;
a fan mounted on the fan holder, the fan holder fastening the fan on the heat sink; and
a plurality of wind-guiding wings each having a first end and a second end opposite to the first end, the first and second ends being pivoted to the fan holder such that the wind-guiding wings are capable of adjusting a direction of airflow generated by the fan;
a connecting frame located in the fan holder;
an adjuster;
wherein the fan holder comprises a supporting plate supporting the fan and two mounting plates extending downwardly from two opposite sides of the supporting plate, the first and second ends of each of the wind-guiding wings having an upper side thereof pivoted to the mounting plates, respectively;
wherein the connecting frame comprises an elongated driving plate, the first end of each of the wind-guiding wings having a lower side thereof pivoted to the driving plate, the connecting frame being selectably slidable relative to a corresponding mounting plate of the fan holder so as to drive each of the wind-guiding wings to pivot relative to the fan holder, and the connecting frame further being selectably fixable relative to the fan holder to maintain the wind-guiding wings in a selected pivoted position;
wherein the connecting frame comprises a connecting portion extending from the driving plate, the adjuster securing the connecting portion to the corresponding mounting plate of the fan holder; and
wherein the connecting frame has a T-shaped configuration.

4. The heat dissipation device of claim 3, wherein the adjuster comprises a bolt and a knob threadedly connected with the bolt, the corresponding mounting plate of the fan holder defining a slot, the bolt extending through the connecting portion and the slot and sliding in the slot.

5. An electronic device comprising:
a first electronic component;
a heat sink attached to the first electronic component, the heat sink defining a plurality of air passages therein, the air passages being arranged in a crisscross pattern;
at least a second electronic component adjacent the first electronic component;
a fan holder mounted on the heat sink;
a fan mounted on the fan holder, the fan holder fastening the fan on the heat sink; and
an adjustable wind-guiding module below the fan, the adjustable wind-guiding module configured for selectably guiding airflow produced by the fan to not only pass through the air passages of the heat sink but also flow towards the at least a second electronic component;
an adjuster;
wherein the adjustable wind-guiding module comprises a plurality of wind-guiding wings and a driving plate, a first end and a second end opposite to the first end of each of the wind-guiding wings having an upper side thereof respectively pivoted to two opposite sides of the fan holder, the first end of each of the wind-guiding wings having a lower side thereof pivoted to the driving plate;
wherein a connecting portion integrally extends from the driving plate, the adjuster securing the connecting portion to a corresponding one of the opposite sides of the fan holder when the driving plate moves relative to the corresponding one of the opposite sides of the fan holder to a desired location in such manner that a lower side of each of the wind-guiding wings rotates around an upper side of each of the win-guiding wings to the desired location; and
wherein the adjuster extends through the corresponding one of the opposite sides of the fan holder and is slidable relative to the fan holder.

* * * * *